United States Patent
Kim et al.

(10) Patent No.: US 6,714,101 B2
(45) Date of Patent: Mar. 30, 2004

(54) NOISE REDUCTION FILTER ARRAY

(75) Inventors: Byung Taek Kim, Ansan (KR); Jeong Ho Yoon, Seoul (KR); Byeung Gyu Chang, Suwon (KR); Dae Hyeong Lee, Seoul (KR); Min Cheol Park, Suwon (KR); Moon Soo Park, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 10/054,986

(22) Filed: Jan. 25, 2002

(65) Prior Publication Data
US 2003/0085777 A1 May 8, 2003

(30) Foreign Application Priority Data
Nov. 5, 2001 (KR) ........................... 2001-68603

(51) Int. Cl.[7] ................................. H03H 7/01
(52) U.S. Cl. ........................ 333/177; 333/185
(58) Field of Search ............... 333/177, 181, 333/182, 184, 185; 361/330

(56) References Cited
U.S. PATENT DOCUMENTS 2,523,778 A * 9/1950 Randall ............... 336/184
5,392,019 A * 2/1995 Ohkubo ............... 333/185
5,578,981 A * 11/1996 Tokuda ................ 333/185
5,602,517 A * 2/1997 Kaneko et al. ........ 333/185
6,147,573 A * 11/2000 Kumagai et al. ...... 333/185
6,281,767 B1 * 8/2001 Lastrucci .............. 333/177
6,476,689 B1 * 11/2002 Uchida et al. ......... 333/177
6,483,400 B1 * 11/2002 Phillips, Jr. ............ 333/185

FOREIGN PATENT DOCUMENTS

| JP | 06-151245 A | * | 5/1994 | ............ H01G/4/42 |
| JP | 07-202616 | | 8/1995 | ............ H03H/7/01 |

* cited by examiner

Primary Examiner—Robert Bost
Assistant Examiner—Dean Takaoka
(74) Attorney, Agent, or Firm—Lowe Hauptman Gilman & Berner LLP

(57) ABSTRACT

Disclosed herein is an array type noise reduction filter. The array type noise reduction filter has a plurality of noise reduction filters horizontally arranged within a single chip. A plurality of noise reduction filters each have an inductance portion, a ground portion, and a capacitance portion. The inductance portion is comprised of first and second coils approximately vertically connected in the chip. The ground portion is arranged over or under the inductance portion. The capacitance portion is arranged over or under the ground portion. A second coil of any inductance portion is constructed to be wound in a direction opposite to a second coil of another adjacent inductance portion.

7 Claims, 4 Drawing Sheets

NOISE REDUCTION FILTER ARRAY

BACKGROUND OF THE INVENTION

1. Field of the Invention

The present invention relates generally to a noise reduction filter array, and more particularly to a noise reduction filter array, in which each inductance portions is formed of two coil portions, and winding directions of the coil portions are set to be different so as to offset mutual interference, thus minimizing the generation of electromagnetic interference.

2. Description of the Prior Art

Generally, when electronic devices are operated, electromagnetic wave noises such as various types of power noises or clock pulse source noises exist within the devices. Especially, in mobile communication terminals, as power frequency becomes higher, great electromagnetic wave noise is generated.

Such electromagnetic wave noises are mutually propagated between circuits along circuit power lines or signal lines within electronic devices, thus causing incorrect operation of each device. Further, power noise or clock pulse source noise generated within an electronic device set is propagated to another electronic device set along a power supply line of the device set, thus causing interference with a normal operation of another electronic device set. On the other hand, a corresponding electronic device set can interfere with its normal operation due to noise propagated from another device. The interference phenomenon due to such electromagnetic wave noises is so called Electro-Magnetic Interference (EMI).

Therefore, for the purpose of performing normal operation of electronic devices, methods for reducing the electromagnetic wave noises must be considered in order to prevent this EMI when the devices are designed. Generally, a method for inserting a noise reduction filter between each circuit and each circuit power source of the electronic devices, or between each circuit and each clock pulse source of the electronic devices is used as a method for reducing the electromagnetic wave noises.

Recently, a noise reduction filter array has been popularized as a commonly used noise reduction filter. The noise reduction filter array is constructed in an array type such that a single chip has a plurality of noise reduction filters within it.

FIG. 1a is a schematic sectional view showing a conventional A noise reduction filter array 10. Referring to FIG. 1a, the noise reduction filter array 10 comprises two noise reduction filters 10a and 10b. The noise reduction filters 10a and 10b each has first and second ground electrode layers 12 and 13, capacitance portions 14a and 15a or 14b and 15b, and an inductance portion 17a or 17b. The first and second ground electrode layers 12 and 13 are respectively arranged at the upper and lower portions of a chip 11. The capacitance portions 14a and 15a or 14b and 15b are formed inside each of the first and second ground electrode layers 12 and 13. The inductance portion 17a or 17b is formed in a coil pattern. The first and second ground electrode layers 12 and 13 function as common electrodes shared between the noise reduction filters 10a and 10b. Further, input and output ports (not shown) of each noise reduction filter are formed on the front and back surfaces of the chip 11. The input ports formed on the front surface of the chip 11 are each connected to one end of each of the inductance portions 17a and 17b, and the capacitance portions 14a and 15a, while the output ports formed on the back surface of the chip 11 are each connected to the other end of each of the inductance portions 17a and 17b, and the capacitance portions 14b and 15b.

In the noise reduction filter array 10, the first and second inductance portions 17a and 17b are symmetrically arranged adjacently to each other at the center portion of the chip 11, thus causing inductance coupling due to mutual inductance. In other words, crosstalk which is mutual electromagnetic interference can occur between the noise reduction filters 10a and 10b. Consequently, the noise reduction filter array is problematic in that undesirable influence is generated between the filters 10a and 10b due to the mutual interference, thus causing the incorrect operation of each noise reduction filter.

FIG. 1b is a graphic view showing the electromagnetic interference characteristics of a conventional noise reduction filter array. Referring to FIG. 1b, a full line represents characteristics of each noise reduction filter in the noise reduction filter array, and a dotted line represents the electromagnetic interference characteristics generated between the noise reduction filters. As shown with the dotted line, in the conventional noise reduction filter array, crosstalk occurs largely between the noise reduction filters. This is due to the mutual inductance generated between the filters arranged within a single chip, as described above. Therefore, such mutual inductance causes electromagnetic interference between the filters, thus deteriorating the filter characteristics of the array type noise reduction filter.

As described above, in this noise reduction filter technical field, a new noise reduction filter array has been required for effectively preventing crosstalk from occurring due to the mutual inductance between the inductance portions of respective noise reduction filters.

SUMMARY OF THE INVENTION

Accordingly, the present invention has been made keeping in mind the above problems occurring in the prior art, and an, object of the present invention is to provide an noise reduction filter array, in which each inductance portions is formed of a plurality of coils, and winding directions of some of the coils are set opposite each other, so as to offset mutual interference generated between the coils of the noise reduction filters due to mutual inductance, thus minimizing electromagnetic interference.

In accordance with one aspect of the present invention, the above and other objects can be accomplished by the provision of noise reduction filter array having a plurality of filters horizontally arranged within a single chip, each filter comprising, two inductance portions comprised of first and second coils connected vertically in the chip, a ground portion arranged over or under the inductance portion, and a capacitance portion arranged over or under the ground portion, wherein the first coil of one inductance portion is constructed to be wound in the same direction as that of the first coil of the other adjacent inductance portion, and the second coil of the one inductance portion is constructed to be wound in a direction opposite to the second coil of the other adjacent inductance portion According to a preferred embodiment of this invention, inductance values of the first and second coils are set to be approximately the same value, such that mutual inductance generated by adjacent coils wound in opposite directions can be effectively offset.

According to another embodiment of this invention, the ground portion can be comprised of a first ground portion arranged over the inductance portion and a second ground portion under the inductance portion. In this case, preferably the capacitance portion is comprised of a first capacitance portion arranged under the first ground portion and a second capacitance portion arranged over the second ground portion.

According to still another preferred embodiment of this invention, the ground portion is arranged at one position of upper and lower portions of the chip, and the capacitance portion is comprised of a first capacitance portion arranged over the ground portion and a second capacitance portion arranged under the ground portion to be opposite the first capacitance portion, such that each noise reduction filter is formed in the shape of pi ($\pi$).

On the other hand, the ground portion is formed of a single layer shared between a plurality of noise reduction filters, such that it is provided as a c on ground electrode for a plurality of noise reduction filters.

According to the most preferred embodiment of this invention, each noise reduction filter further comprises an isolation means formed between the first and second coils to isolate the first and second coils from undesirable electromagnetic influence between the first and second coils. Preferably, such an isolation means can be a conductor layer having a via hole for connecting the first coil to the second coil.

In accordance with another aspect of the present invention, there is provided a noise reduction filter array having a plurality of filters horizontally arranged within a single chip, each filter comprising, two inductance portions, each comprised of first and second coil connected vertically within the chip, and each arranged horizontally, a ground portion arranged at at least one position over or under the inductance portions according to the arrangement direction of the inductance portions, a plurality of capacitance portions each vertically arranged over or under the ground portion in approximately the same direction as that of each of the inductance portions, and an isolation means for blocking electromagnetic influence between the first and the second coil of each of the inductance portions, wherein the first coil of one inductance portion is constructed to be wound in the same direction as that of the first coil of the other adjacent inductance portion, and the second coil of the one inductance portion is constructed to be wound in a direction opposite to the second coil of the other adjacent inductance portion.

BRIEF DESCRIPTION OF THE DRAWINGS

The above and other objects, features and other advantages of the present invention will be more clearly understood from the following detailed description taken in conjunction with the accompanying drawings, in which:

FIGS. 3b and 3c are graphic views showing the characteristics of each of the noise reduction filters of FIG. 3a.

DESCRIPTION OF THE PREFERRED EMBODIMENTS

Figure 1A:
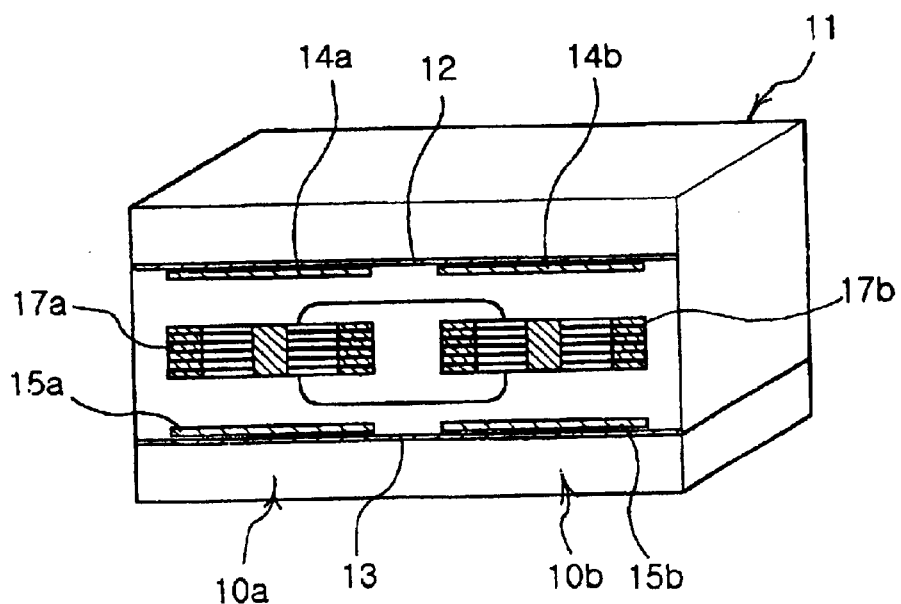
FIG. 1a is a schematic sectional view showing a conventional noise reduction filter array.
Figure 1B:
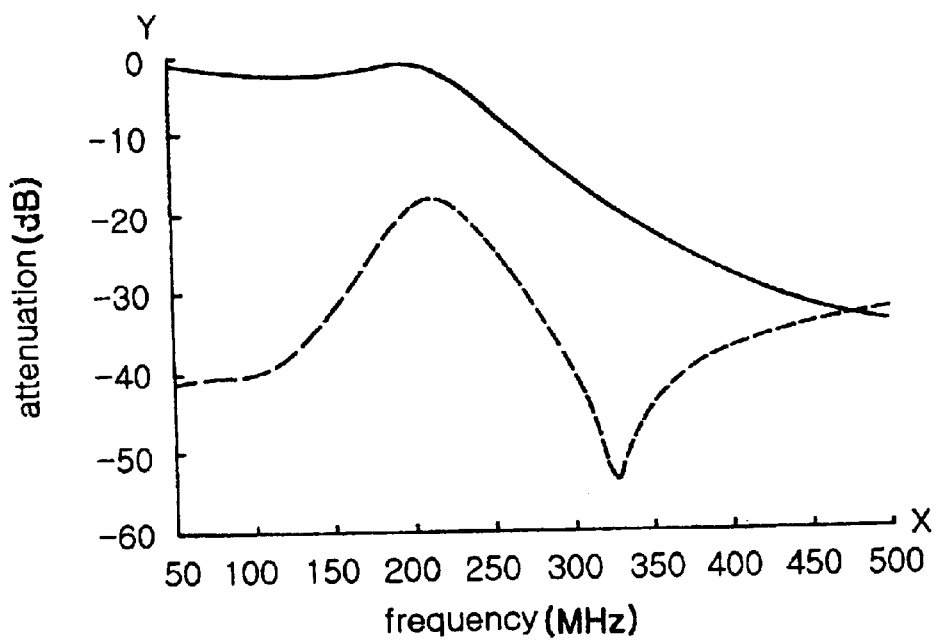
FIG. 1b is a graphic view showing the electromagnetic interference characteristics of the conventional—noise reduction filter array.
Figure 2:
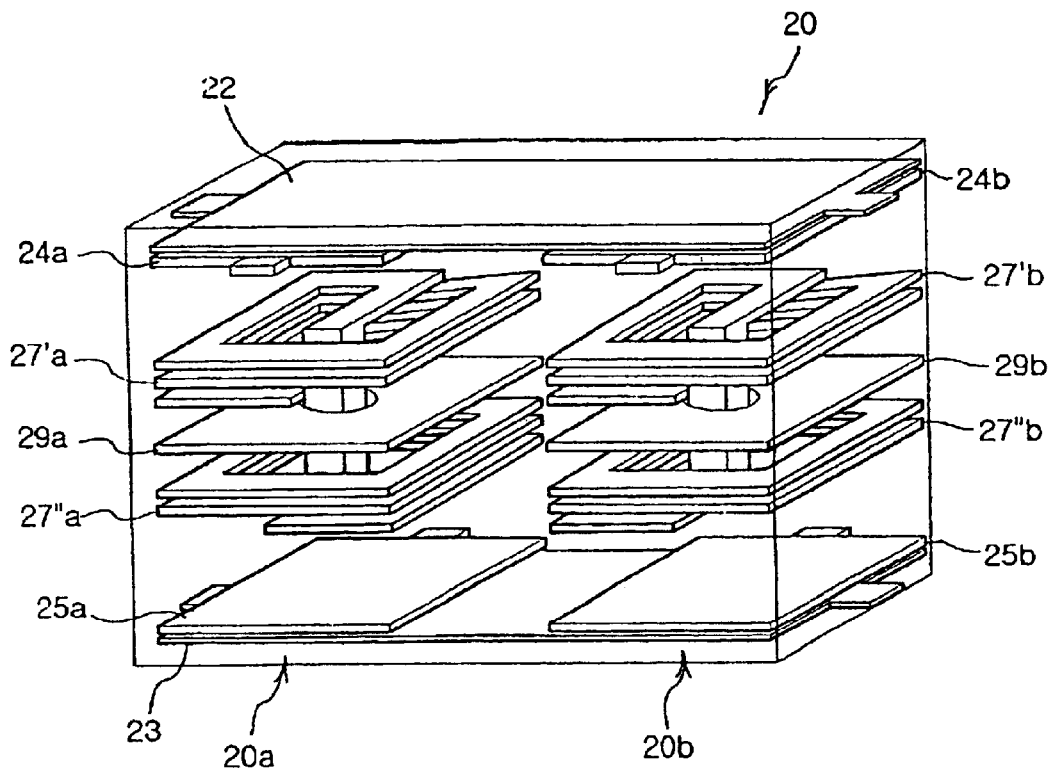
FIG. 2 is a schematic perspective view showing a noise reduction filter array having two noise reduction filters according to a preferred embodiment of this invention.

FIG. 2 is a schematic perspective view showing a noise reduction filter array 20 according to a preferred embodiment of this invention. Referring to FIG. 2, the noise reduction filter array 20 comprises two noise reduction filters 20a and 20b within a single chip 21. The noise reduction filters 20a and 20b are each comprised of first and second ground electrodes 22 and 23, a first capacitance portion 24a or 24b, a second capacitance portion 25a or 25b, and an inductance portion. One end of the first capacitance portion 24a or 24b is connected to the first ground portion 22, and the other end thereof is connected to input ports (not shown). Further, one end of the second capacitance portion 25a or 25b is connected to the second ground portion 23, and the other end thereof is connected to output ports (not shown). One end of the inductance portion is connected to the input ports and the other end thereof is connected to the output ports. Especially, in the present invention, the inductance portion is comprised of a first coil 27a' or 27b' and a second coil 27a" or 27b". Further, a conductor layer 29a or 29b is provided as an electromagnetic isolation means between the first coil 27a' or 27b' and the second coil 27a" or 27b".

As shown in FIG. 2, each inductance portion is formed of first and second coils 27a' and 27a", or 27b' and 27b" vertically connected. The first coil 27a' of one inductance portion is formed in the same winding direction as that of the first coil 27b' of the other inductance portion. However, the second coil 27a" is formed in a winding direction opposite to that of the second coil 27b" of the other inductance portion. Therefore, mutual inductance having a polarity opposite to the mutual inductance induced between the first coils 27a' and 27b' is induced between the second coils 27a" and 27b". In such a structure, mutual inductances having opposite polarities are generated between the first and second coils, such that the mutual inductances can offset each other. Here, it is preferable to arrange each of first and second coils of one inductance portion on approximately the same plane as each of the first and second coils of the other inductance portion. Further, it is preferable to set the first and second coils to have the same inductance value $L_a$ when the same voltage is applied. This perfectly offsets mutual inductance M induced between the first coils and mutual inductance -M induced between the second coils, thus entirely minimizing electromagnetic interference.

However, the present invention is characterized in that electromagnetic interference is reduced through an offset operation between mutual inductances having opposite polarities by forming the inductance portions as two coils and adjusting each direction of the coils. Therefore, even if each of the first and second coils of one inductance portion is not arranged on the same plane as that of the other inductance portion, or the first and second coils do not have the same inductance value, it probably belongs to the range of the present invention that the direction of any one of the first and second coils is set differently from the other to minimize electromagnetic interference. Further, in the preferred embodiment of this invention, the first and second ground portions 22 and 23 are each formed as a common electrode for two noise reduction filters. However, the ground portions 22 and 23 can each be divided into two ground electrodes for respective noise reduction filters.

Further, in the preferred embodiment of this invention, conductor layers as isolation means for isolating the first and second coils from electromagnetic influence are formed. In other words, the conductor layers serve to prevent inductance values due to mutual influence between the first and second coils from varying. Preferably, plate-shaped conductor layers each having a via hole for connecting the first and second coils to each other can be used as conduction layers for blocking the mutual electromagnetic influence while connecting the first coil to the second coil. The isolation means such as the conduction layers are described below in detail.

Figure 3A:
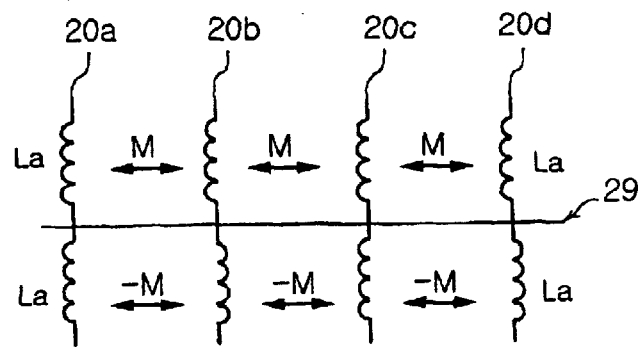
FIG. 3a is a circuit diagram of a noise reduction filter array having four noise reduction filters according to a preferred embodiment of this invention.

FIG. 3a is a circuit diagram of an array type noise reduction filter having four noise reduction filters according to a preferred embodiment of this invention. In FIG. 3a, capacitance portions and ground portions are omitted so as to conveniently describe functions of the inductance portions of the filters and the conductor layers included in the inductance portions.

Referring to FIG. 3a, inductance portions of four noise reduction filters 20a, 20b, 20c and 20d are each formed to be separated into first and second coils (inductance La of FIG. 3a). In the case that inductance portions are each formed to be separated into two coils just as the inductance portions adapted to the present invention, it is difficult to exactly adjust total inductance value of the two coils. In other words, provided that the inductance value of each of the first and second coils is La, if two coils are formed in the same winding direction, the total inductance value of the two coils becomes larger than 2La, while if two coils are formed in opposite winding directions, its total inductance value becomes smaller than 2La. Thereby, it is difficult to previously set the total inductance value as the same value required by the inductance portions of the four noise reduction filters. Consequently, a problem in that it is difficult to design the noise reduction filters by exactly predicting the characteristics of each of the noise reduction filters is caused.

Therefore, the conductor layer 29 for preventing the mutual electromagnetic influence between two coils is formed between the first and second coils, such that the variation of the total inductance value due to the interaction of the two coils can be prevented. As a result, each inductance portion can be embodied to have the same inductance value. Further, if inductance portions are each required to employ another desired inductance value, the total inductance value can be easily adjusted by selecting each inductance value of the first and second coils.

Figure 3B:
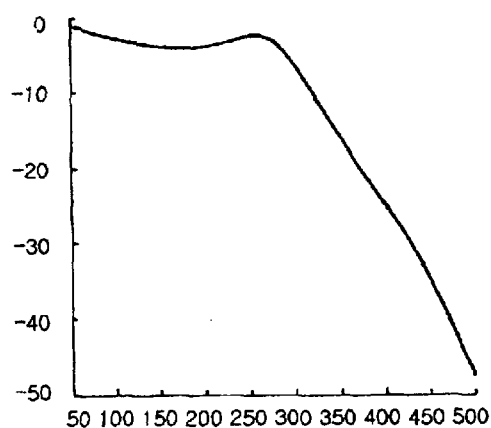
Figure 3C:
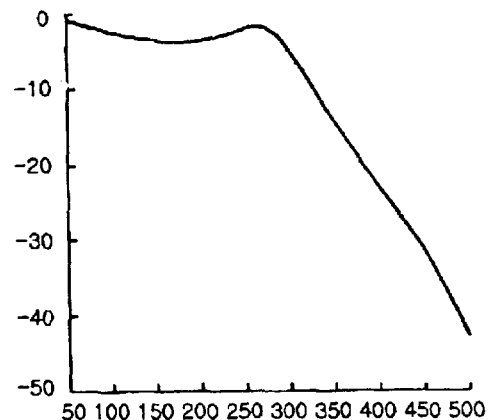

FIGS. 3b and 3c are graphic views showing the characteristics of each of the noise reduction filters. FIG. 3b shows the characteristics of the first and third noise reduction filters, and FIG. 3c shows the characteristics of the second and fourth noise reduction filters. In the first and third noise reduction filters, the second coil of each inductance portion has the same winding direction as that of the first coil. In the second and fourth noise reduction filters, the second coil of each inductance portion has a winding direction opposite to that of the first coil.

In this case, in the first and third noise reduction filters, typically the total inductance value of the first and second coils of each inductance portion may be larger than the sum of the inductance values of the first and second coils, while in the second and fourth noise reduction filters, the total inductance value of the first and second coils of each inductance portion may be smaller than the sum of the inductance values of the first and second coils. However, in the preferred embodiment of this invention, the conductor layer for blocking the electromagnetic influence between the first and second coils is formed, such that each total inductance value for all inductance portions has almost the same value as the sum of the inductance values of the two coils. Therefore, as shown in FIGS. 3b and 3c, the noise reduction filters, in which the winding direction of the second coil is opposite to the first coil, have approximately the same low pass characteristics.

Figure 4:
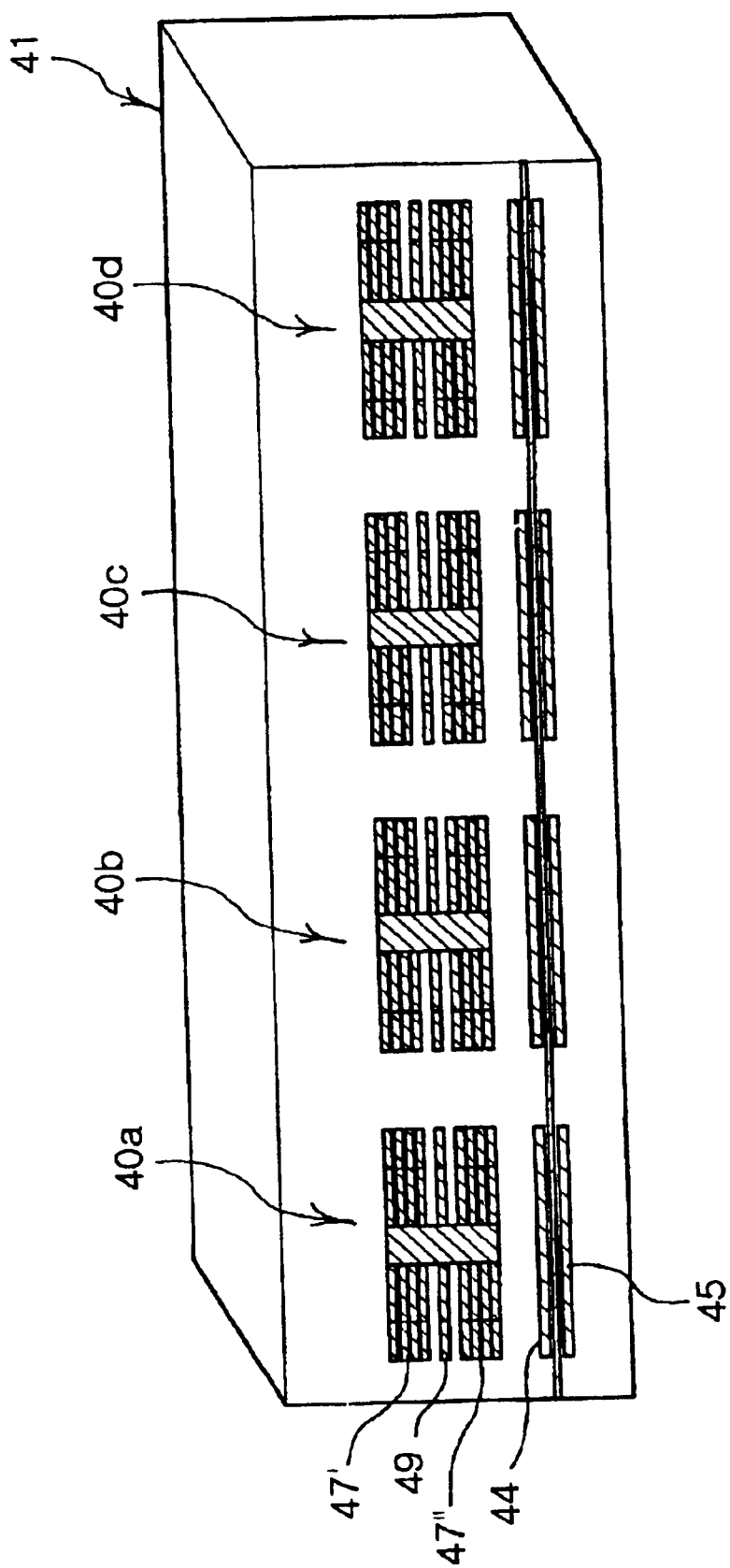
FIG. 4 is a schematic sectional view showing another noise reduction filter array having four noise reduction filters according to another preferred embodiment of this invention.

FIG. 4 is a schematic sectional view showing another array type noise reduction filter 40 having four noise reduction filters 40a, 40b, 40c and 40d according to another preferred embodiment of this invention. Referring to FIG. 4, in the array type noise reduction filter 40, a ground electrode 42 and first and second capacitance portions 44 and 45 can be concentrically formed at the lower portion of a chip 41. Further, the ground electrode 42 can be formed as a common electrode shared between the four noise reduction filters 40a, 40b, 40c and 40d. As described above, the ground electrode 42 is formed as one electrode, thus saving one ground electrode in comparison with the embodiment using two ground electrodes as shown in FIG. 2. Accordingly, the embodiment of FIG. 4 is advantageous in that it can simplify the manufacturing process of the array type noise reduction filter, in addition to reducing its manufacturing costs. The preferred embodiment of this invention can be similarly adapted such that the ground electrode 42 and the capacitance portions 44 and 45 are concentrically formed at the upper portion of the chip 41.

As shown in FIG. 4, pi-shaped noise reduction filters in which the capacitance portions 44 and 45 are respectively arranged over and under the ground electrode 42 can be modified by omitting one of the capacitance portions 44 and 45. In such a structure, preferably the capacitance portion is connected to one of the input and output ports of each noise reduction filter so as to realize the same characteristics.

In other words, it is preferable to embody the noise reduction filters each employing one capacitance portion in the manufacturing process, because the input ports or output ports connected to the capacitance portion are arranged to the same position when each capacitance portion is arranged at only one position over or under the ground electrode.

As described above, the present invention provides an array type noise reduction filter, which inductance portions of noise reduction filters are each formed of first and second coils, and the winding directions of some of the coils are set opposite each other, such that mutual interference generated between the coils of the noise reduction filters due to mutual inductance can be offset. Further, the present invention is advantageous in that mutual electromagnetic interference can be minimized by forming conductor layers between first and second coils to block mutual influence between the coils, and required filter characteristics can be designed by realizing exact inductance values.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A noise reduction filter array, comprising:
   two inductance portions each comprising first and second coils which are electrically connected together, one of the first and second coils being put on top of the other;
   a ground portion arranged only either over or under the inductance portions; and
   a first capacitance portion arranged over the ground portion and a second capacitance portion arranged under the ground portion;

wherein the first coils of said inductance portions are wound in the same direction, and the second coils of said inductance portions are wound in opposite directions.

2. The noise reduction filter array according to claim 1, wherein the ground portion is a common electrode formed as a single layer and shared between said inductance portions.

3. A noise reduction filter array, comprising:
two inductance portions each comprising first and second coils which are electrically connected together, one of the first and second coils being put on top of the other;
a first ground portion arranged over the inductance portions and a second ground portion arranged under the inductance portions; and
a first capacitance portion arranged under the first ground portion and a second capacitance portion arranged over the second ground portion;
wherein the first coils of said inductance portions are wound in the same direction, and the second coils of said inductance portions are wound in opposite directions.

4. The noise reduction filter array according to claim 3, wherein the first and second coils have approximately the same inductance value.

5. A noise reduction filter array, comprising:
two inductance portions each comprising first and second coils which are electrically connected together, one of the first and second coils being put on top of the other;
a ground portion arranged over or under the inductance portions; and
a capacitance portion arranged over or under the ground portion;
wherein the first coils of said inductance portions are wound in the same direction, and the second coils of said inductance portions are wound in opposite directions;
said noise reduction filter array further comprising, for each of said inductance portions, isolation means positioned between the first and second coils for blocking electromagnetic influence therebetween.

6. The noise reduction filter array according to claim 5, wherein the isolation means comprise a conductor layer having a via hole for electrical connection between the first and second coils.

7. A noise reduction filter array, comprising a plurality of filters horizontally arranged side by side within a single chip, each filter comprising:
an inductance portion comprising first and second coils which are serially electrically connected together, the first coil being vertically arranged on top of the second coil;
a ground portion vertically arranged at at least one position over or under the inductance portion;
a capacitance portion vertically arranged over or under the ground portion; and
isolation means for blocking electromagnetic influence between the first and second coils of the inductance portion;
wherein, for two adjacent said filters, the first coils of the inductance portions of said adjacent filters are wound in the same direction, and the second coils of the inductance portions of said adjacent filters are wound in opposite directions.

* * * * *